(12) United States Patent
Wong

(10) Patent No.: US 6,419,170 B1
(45) Date of Patent: Jul. 16, 2002

(54) ADJUSTABLE NOZZLE ASSEMBLY FOR SEMICONDUCTOR WAFER BACKSIDE RINSING

(75) Inventor: Larry Ping-Kwan Wong, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/401,742

(22) Filed: Sep. 23, 1999

Related U.S. Application Data

(63) Continuation-in-part of application No. 09/345,398, filed on Jul. 1, 1999.

(51) Int. Cl.[7] .............................................. B05B 15/08
(52) U.S. Cl. .................... 239/587.1; 239/273; 239/280; 239/280.5; 239/281; 239/587.2; 239/589
(58) Field of Search .................................. 239/273, 280, 239/280.5, 281, 587.1, 587.2, 589

(56) References Cited

U.S. PATENT DOCUMENTS

| | | | | |
|---|---|---|---|---|
| 1,577,225 A | * | 3/1926 | Granger | |
| 2,776,168 A | * | 1/1957 | Schweda | |
| 2,895,682 A | * | 7/1959 | Tavone | |
| 3,684,179 A | * | 8/1972 | Fischer et al. | |
| 5,785,068 A | | 7/1998 | Sasaki et al. | |
| 6,032,512 A | | 3/2000 | Li | |

OTHER PUBLICATIONS

Abstract of Japanese Patent Publication 10–113578, Patent Abstracts of Japan, vol. 1998, No. 10, Aug. 31, 1998.

* cited by examiner

*Primary Examiner*—Robin O. Evans
(74) *Attorney, Agent, or Firm*—Martine & Penilla, LLP

(57) ABSTRACT

A nozzle assembly includes a connector tube having a first end and a second end. An outer surface of the connector tube is threaded. A first cap having an opening therethrough is threaded onto the first end of the connector tube. A second cap having an opening therethrough is threaded onto the second end of the connector tube. Each of the first and second caps has a top surface and a threaded inner surface. The nozzle assembly further includes a nozzle having a tubular portion defining a channel. The tubular portion is disposed in the opening of the first connector cap so that a position of the nozzle can be axially and rotationally adjusted. A spin, rinse, and dry station including the adjustable nozzle assembly and a method for spin rinsing the bottom side, i.e., the backside, of a semiconductor wafer also are described.

9 Claims, 9 Drawing Sheets

ADJUSTABLE NOZZLE ASSEMBLY FOR SEMICONDUCTOR WAFER BACKSIDE RINSING

CROSS REFERENCE TO RELATED APPLICATIONS

This application is a continuation-in-part of U.S. patent application Ser. No. 09/345,398, filed Jul. 1, 1999, and entitled "Method for Validating Pre-Process Adjustments to a Wafer Cleaning System." This patent application, from which priority under 35 U.S.C. § 120 is claimed, is incorporated herein by reference.

BACKGROUND OF THE INVENTION

The present invention relates generally to semiconductor fabrication and, more particularly, to an adjustable nozzle assembly, a spin, rinse, and dry station for spin rinsing a bottom side of a semiconductor wafer including the adjustable nozzle assembly, and a method for spin rinsing a bottom side of a semiconductor wafer.

In the fabrication of semiconductor devices, a variety of wafer preparation operations are performed. In one such preparation operation, deionized (DI) water is sprayed onto the wafer in, e.g., a spin, rinse, and dry (SRD) station, to rinse off the residual chemical solution and to remove particulate contamination. Until recently, efforts to rinse effectively and to control wafer contamination have primarily focused on the top side of wafers. As the semiconductor industry moves to larger, e.g., 300 mm, wafers and to smaller, e.g., 0.18 µm and smaller, feature sizes; however, it is becoming increasingly more important to rinse effectively and to control wafer contamination on the bottom side, i.e., the backside, of wafers. FIG. 1A is a simplified schematic crosssection illustrating one conventional technique used to spray DI water onto the bottom side of a wafer in an SRD station. As shown therein, wafer 10 is supported by rollers 14, which contact the edge of wafer 10 to avoid introducing particulate contaminants to either top side 10a or bottom side 10b of the wafer. A nozzle 16, which is coupled to a source 18 of DI water via liquid supply tube 20, is positioned at the bottom of bowl 12. As wafer 10 is spun, nozzle 16 sprays DI water toward the bottom side 10b of the wafer.

To thoroughly clean the bottom side of a wafer, it is imperative that the spray of DI water contacts the center of the wafer. If the spray contacts only a peripheral portion of the wafer, then the centrifugal force generated by the rotation of the wafer prevents the DI water from reaching the center of the wafer. As a result, residual chemical solution and contaminants, e.g., particles, may not be removed from the central portion of the bottom side of the wafer. If the amount of particulate contamination on the bottom side of the wafer exceeds acceptable levels, then the yield rate may be decreased significantly.

FIG. 1B is an enlarged view of nozzle 16 shown in FIG. 1A. As shown in FIG. 1B, nozzle 16 includes a base portion 16a from which a pair of generally elbow-shaped outlets 16b extend. The upright sections of outlets 16b are angled slightly inwardly, i.e., slightly toward base portion 16a. Below base portion 16a, threaded portion 16c and connector portion 16d are provided. Threaded portion 16c is screwed into a fixture disposed below the bottom of bowl 12 (see FIG. 1A) to hold nozzle 16 in place. One end of liquid supply tube 20 (see FIG. 1A) is coupled to connector portion 16d.

As shown in FIG. 1A, nozzle 16 is positioned a distance from the center of the bottom of the bowl because a rotatable shaft, which rotates the spindle arm and spindle fingers to which rollers 12 are attached, is positioned at the center of the bottom of the bowl. As a result of this off-center positioning, the DI water sprayed from outlets 16b of nozzle 16 is directed toward the peripheral portion of the bottom side 10b of wafer 10. The elbow-shaped outlets 16b are formed of rigid plastic and therefore the position of such outlets can be adjusted only to a minimal extent, if at all. Furthermore, once nozzle 16 is fully screwed into the fixture, the height of nozzle 16 is fixed and cannot be raised.

In light of the limited adjustability of the nozzle in a conventional SRD station such as shown in FIG. 1A, problems have been experienced in configuring the system so that DI water sprayed from the nozzle contacts the center of the bottom of the wafer. To further complicate the situation, once the wafer is disposed in the bowl, an operator cannot tell where DI water contacts the bottom side of the wafer because the opaque wafer blocks the operator's line of sight. Thus, even if limited adjustments are made, the operator has no reliable way of determining whether the spray of DI water is properly contacting the center of the bottom side of the wafer.

In view of the foregoing, there is a need for a method and device for spin rinsing a bottom side of a wafer that ensures that the spray of DI water contacts the center of the wafer.

SUMMARY OF THE INVENTION

Broadly speaking, the present invention fills this need by providing a nozzle assembly including an adjustable nozzle. By adjusting the position of the adjustable nozzle, the nozzle may be oriented so that liquid sprayed therefrom is directed toward the center of the bottom side of a semiconductor wafer. The present invention also provides a spin, rinse, and dry station including the adjustable nozzle assembly and a method for spin rinsing a bottom side of a semiconductor wafer.

In accordance with one aspect of the present invention, a nozzle assembly is provided. The nozzle assembly includes a connector tube having a first end and a second end. An outer surface of the connector tube is threaded. A first cap having an opening therethrough is threaded onto the first end of the connector tube. A second cap having an opening therethrough is threaded onto the second end of the connector tube. Each of the first and second caps has a top surface and a threaded inner surface. The nozzle assembly further includes a nozzle having a tubular portion defining a channel. The tubular portion is disposed in the opening of the first connector cap so that a position of the nozzle can be axially and rotationally adjusted.

In one embodiment, the nozzle assembly further includes first and second nuts disposed on the connector tube. If desired, one of the first and second nuts may be integral with the connector tube. The threaded inner surfaces of the first and second connector caps preferably have a first diameter and the openings in the top surfaces of the first and second connector caps preferably have a second diameter, with the second diameter being smaller than the first diameter. In this embodiment, tapered surfaces extend between the threaded inner surfaces of the first and second connector caps and the openings in the top surfaces of the first and second connector caps.

In one embodiment, the nozzle further includes a head portion having a channel defined therein. In this embodiment, the channel defined in the head portion of the nozzle is preferably at an angle of about 35 degrees to about 75 degrees relative to a plane perpendicular to the channel defined in the tubular portion of the nozzle.

In one embodiment, first sealing members are provided proximate to the top surfaces of the first and second connector caps, and second sealing members are provided proximate to the first and second ends of the connector tube. In this embodiment, the first sealing members are preferably split ring seals and the second sealing members are preferably bulkhead fitting seals.

In accordance with another aspect of the present invention, a spin, rinse, and dry (SRD) station for spin rinsing a semiconductor wafer is provided. The SRD station includes a bowl having a bottom wall and a sidewall. A rotational member is disposed in the bowl, with the rotational member being attached to a rotatable shaft. A plurality of support members are attached to the rotational member, with the support members being configured to support a semiconductor wafer above the rotational member. The SRD station also includes a motor for rotating the rotatable shaft and an adjustable nozzle assembly mounted in the bowl. The adjustable nozzle assembly is positioned so as to direct a spray of liquid toward a center of a bottom side of a semiconductor wafer supported in the bowl.

The adjustable nozzle assembly preferably further includes a liquid supply tube disposed in the opening of the second connector cap. The liquid supply tube is preferably coupled to a source of deionized water.

In one embodiment, the adjustable nozzle assembly is disposed in an opening in the bottom wall of the bowl. In this embodiment, the adjustable nozzle assembly includes the components specified above, with the tubular portion of the nozzle being disposed in the opening of the first connector cap so that a position of the nozzle can be vertically and rotationally adjusted. In another embodiment, the adjustable nozzle assembly is disposed in an opening in the sidewall of the bowl. In this embodiment, the adjustable nozzle assembly includes the components specified above, with the tubular portion of the nozzle being disposed in the opening of the first connector cap so that a position of the nozzle can be horizontally and rotationally adjusted.

In one embodiment, the adjustable nozzle assembly further includes first and second nuts disposed on the connector tube. The first and second nuts secure the connector tube to either the bottom wall or sidewall of the bowl, depending on how the adjustable nozzle assembly is mounted in the bowl.

In accordance with yet another aspect of the present invention, a method for spin rinsing a bottom side of a semiconductor wafer is provided. In this method a bowl having an adjustable nozzle for spraying liquid toward a bottom side of a semiconductor wafer disposed in the bowl is first provided. Liquid is then sprayed from the adjustable nozzle onto a center of the bottom side of the semiconductor wafer. Preferably, before liquid is sprayed, the adjustable nozzle is oriented such that liquid sprayed therefrom is directed toward the center of the bottom side of the wafer.

In one embodiment of the invention, the operation of orienting the adjustable nozzle includes (a) orienting the adjustable nozzle such that the adjustable nozzle is pointed toward a position where the semiconductor wafer will be disposed in the bowl for spin rinsing, (b) disposing a substantially transparent substrate in the bowl in the position where the semiconductor wafer will be disposed for spin rinsing, (c) spraying liquid from the adjustable nozzle toward a bottom side of the substantially transparent substrate; (d) observing where the liquid contacts the bottom side of the substantially transparent substrate, (e) adjusting the position of the adjustable nozzle in the event the liquid does not contact a center of the substantially transparent substrate, and (f) repeating operations (b) through (e) until the liquid contacts the center of the substantially transparent substrate.

The nozzle assembly of the present invention advantageously enables an operator to adjust easily the position of the nozzle to compensate for tolerances in the spin station, e.g., the spindle height may vary from spin station to spin station. In the method for spin rinsing a bottom side of a semiconductor wafer of the present invention, a substantially transparent substrate is advantageously used to orient the adjustable nozzle to ensure that liquid, e.g., DI water, is sprayed onto the center of the bottom side of a semiconductor wafer. This ensures that the entire bottom side of the wafer is thoroughly rinsed. Testing has confirmed that use of the nozzle assembly of the present invention with the adjustable nozzle properly oriented yields improved wafer particle counts on the bottom side of semiconductor wafers relative to the conventional nozzle shown in FIGS. 1A and 1B.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Figure 1A:
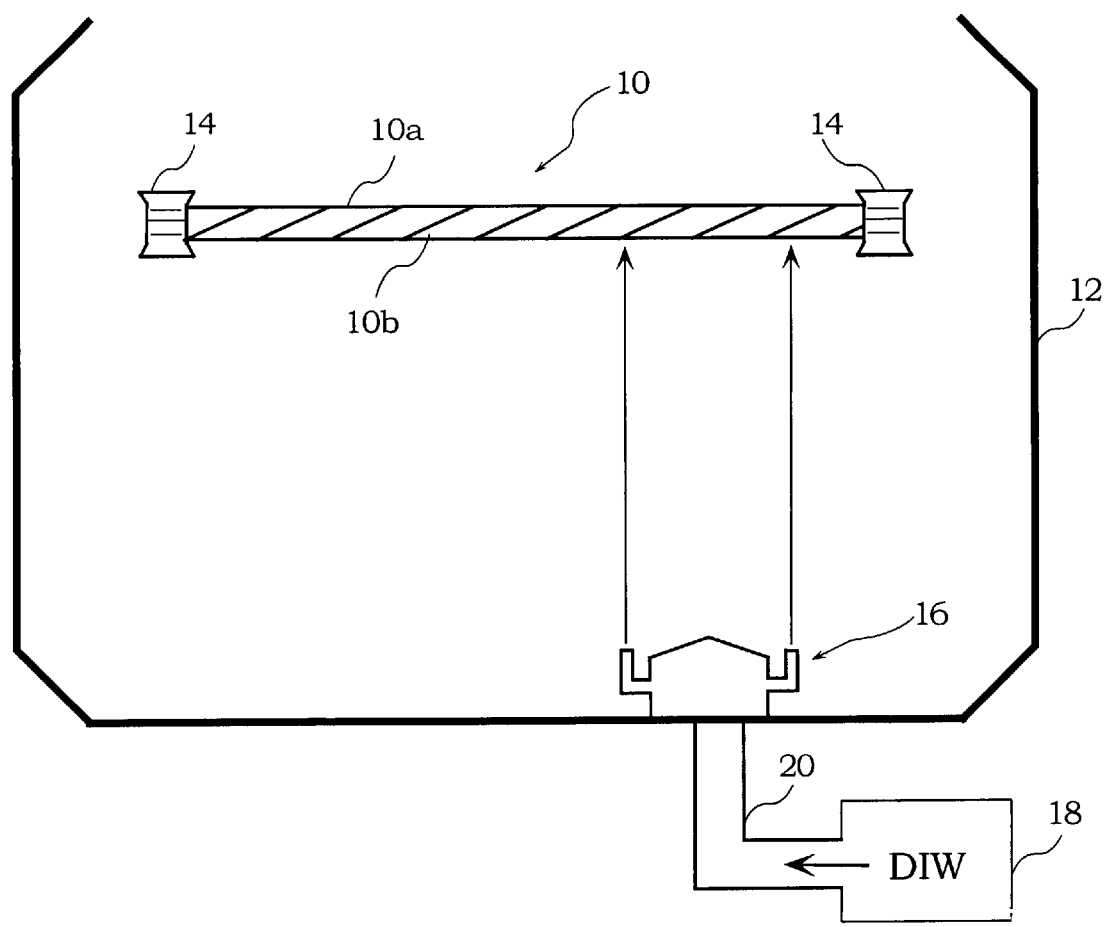
FIG. 1A is a simplified schematic cross-section illustrating the conventional technique used to spray deionized (DI) water on the bottom side of a wafer in a spin, rinse, and dry (SRD) station.
Figure 1B:
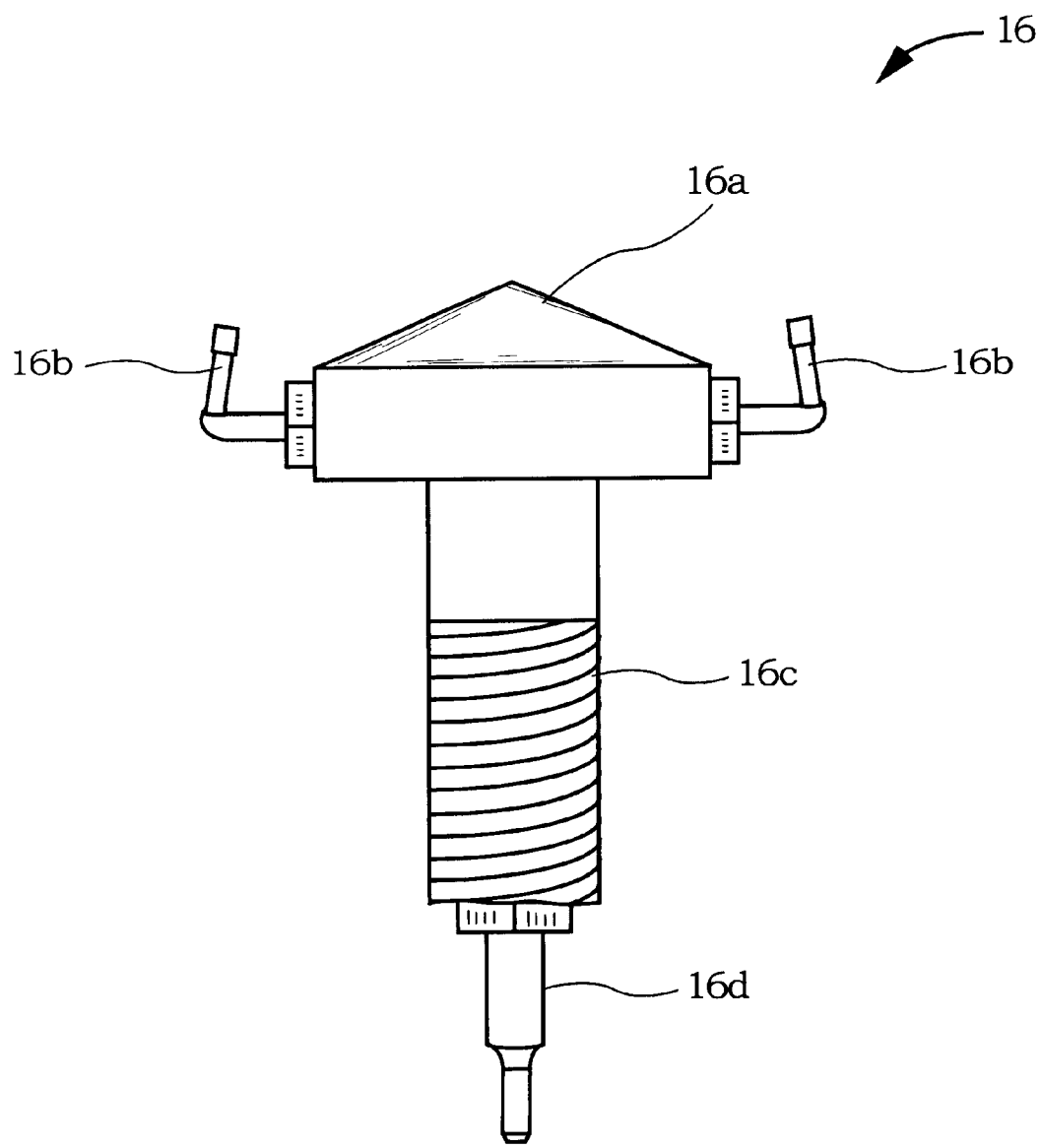
FIG. 1B is an enlarged, detailed view of nozzle 16 shown in FIG. 1A.

The present preferred embodiments of the invention will now be described in detail with reference to the accompanying drawings. FIGS. 1A and 1B are discussed above in the "Background of the Invention" section.

The present invention provides a nozzle assembly in which the nozzle is adjustable both vertically (or horizontally when the nozzle assembly is mounted sideways) and rotationally. The present invention also provides a spin, rinse, and dry (SRD) station in which the adjustable nozzle assembly is used to spray the bottom side of a semiconductor wafer. The present invention further provides a method for spin rinsing the bottom side, i.e., the backside, of a semiconductor wafer. In one embodiment of this method, a substantially transparent substrate, e.g., wafer, may be used to ensure that the adjustable nozzle is properly aligned.

Figure 2:
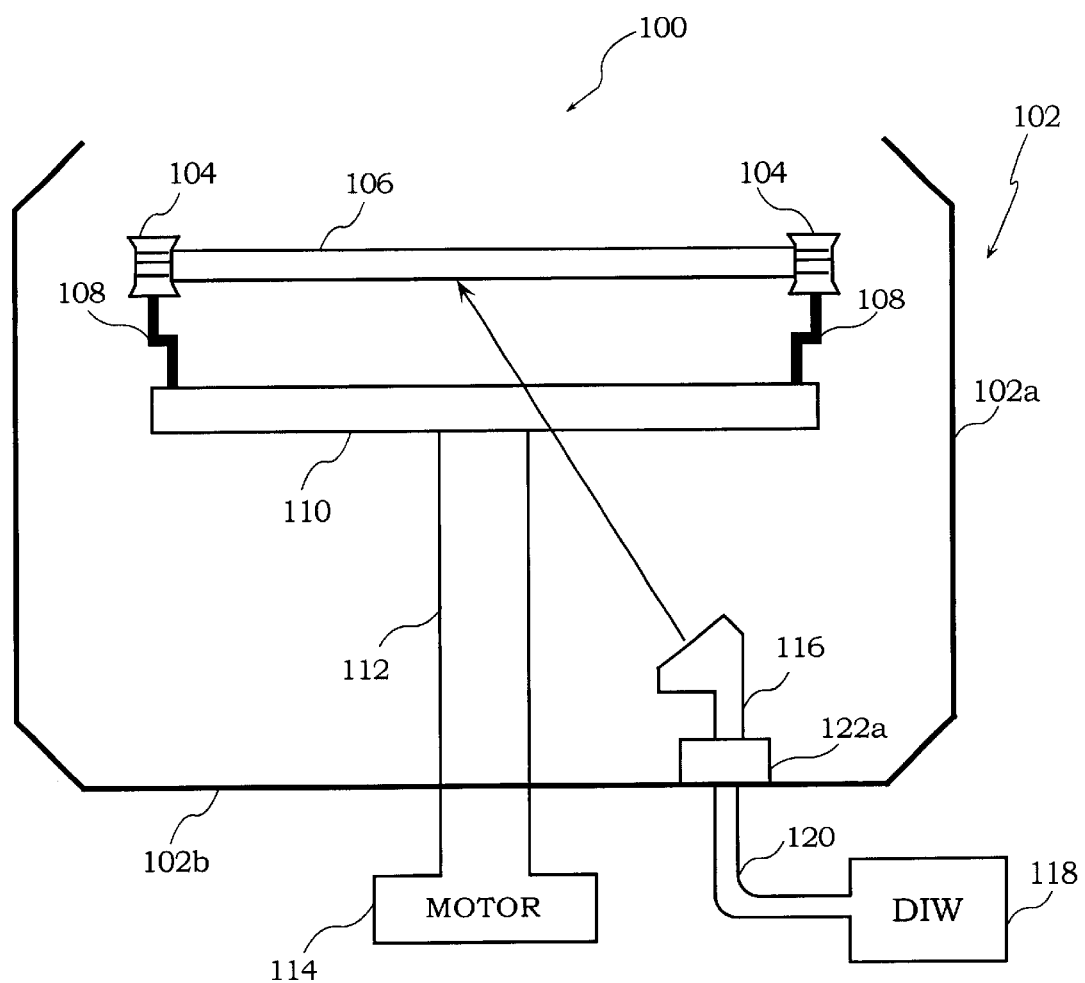
FIG. 2 shows a simplified side view of an SRD station including an adjustable nozzle assembly for spraying the bottom side of a semiconductor wafer in accordance with one embodiment of the invention.

FIG. 2 shows a simplified side view of an SRD station 100 including an adjustable nozzle assembly for spraying the bottom side of a semiconductor wafer in accordance with one embodiment of the invention. As shown therein, bowl 102 includes bottom wall 102a and sidewall 102b that extends upwardly from bottom wall 102a. A plurality of rollers 104 supports substantially transparent wafer 106 along its side edge, with the number of rollers typically being four. Each roller 104 is disposed on one of a corresponding number of spindle fingers 108. Each of spindle fingers 108 is mounted on spindle arm 110, which in turn is mounted on shaft 112. As is well known to those skilled in the art, shaft 112 is coupled to spin motor 114 that rotates the shaft and the structures connected thereto. Adjustable nozzle assembly 116, which is mounted on bottom wall 102b of bowl 102, is coupled to a source 118 of deionized (DI) water through a liquid supply tube 120. Adjustable nozzle assembly 116 is secured to bottom wall 102b by a pair of nuts 122a and 122b (nut 122b is not shown in FIG. 2) disposed on opposite sides of bottom wall 102b, as will be described in more detail later.

The use of substantially transparent wafer 106 enables an operator to determine visually whether DI water sprayed from adjustable nozzle assembly 116 contacts the center of the bottom side of wafer 106. If the spray of DI water does not contact the center of the bottom side of wafer 106, then the operator may make appropriate adjustments to the nozzle. Depending on the nature of the misalignment, the position of the nozzle may be adjusted by moving the nozzle vertically, i.e., up and down, or by rotating the nozzle. Once the nozzle is properly aligned, spin rinsing of semiconductor wafers may commence.

Figure 3:
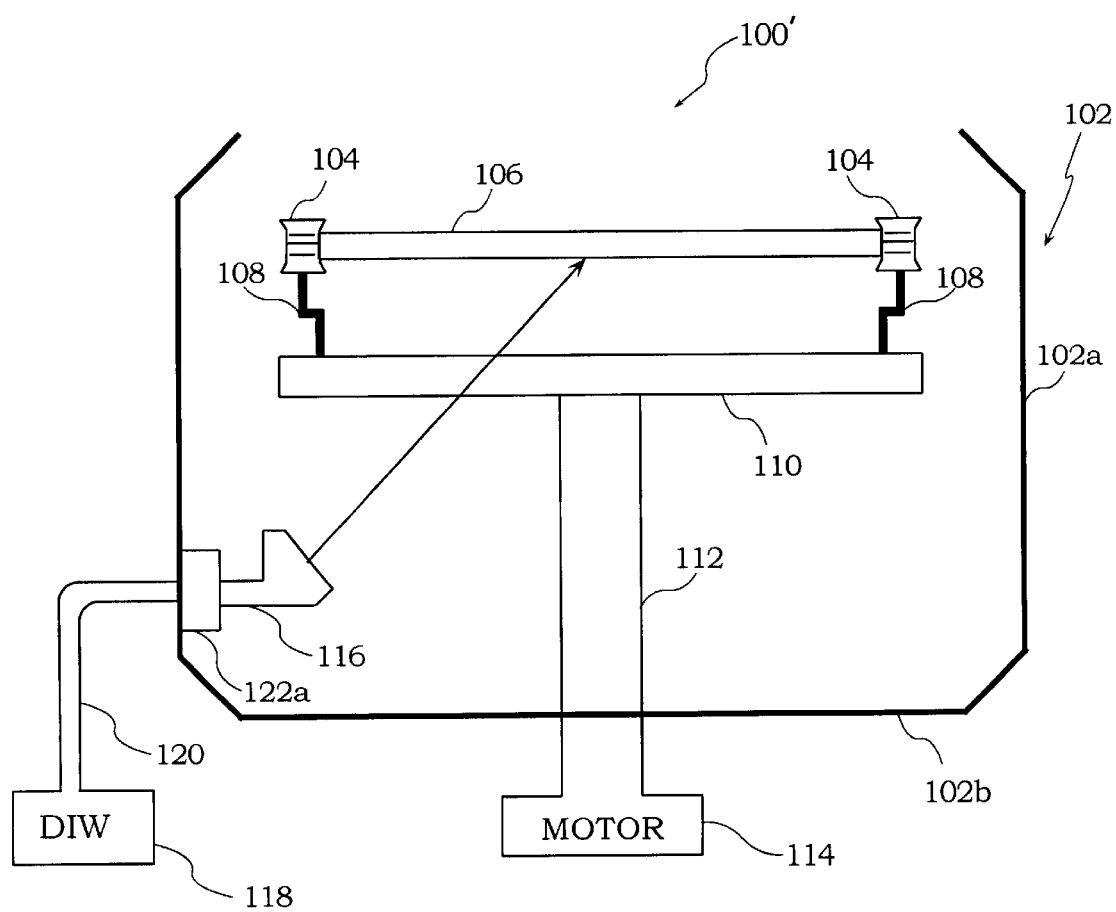
FIG. 3 shows a simplified side view of an SRD station including an adjustable nozzle assembly for spraying the bottom side of a semiconductor wafer in accordance with another embodiment of the invention.

FIG. 3 shows a simplified side view of an SRD station 100' including an adjustable nozzle assembly for spraying the bottom side of a semiconductor wafer in accordance with another embodiment of the invention. As shown therein, adjustable nozzle assembly 116 is mounted on sidewall 102a of bowl 102. Adjustable nozzle assembly 116 is secured to sidewall 102a by a pair of nuts 122a and 122b (nut 122b is not shown in FIG. 3) disposed on opposite sides of sidewall 102a. In this configuration, in the event the nozzle is misaligned, the position of the nozzle may be adjusted by moving the nozzle horizontally, i.e., back and forth, or by rotating the nozzle.

Figure 4:
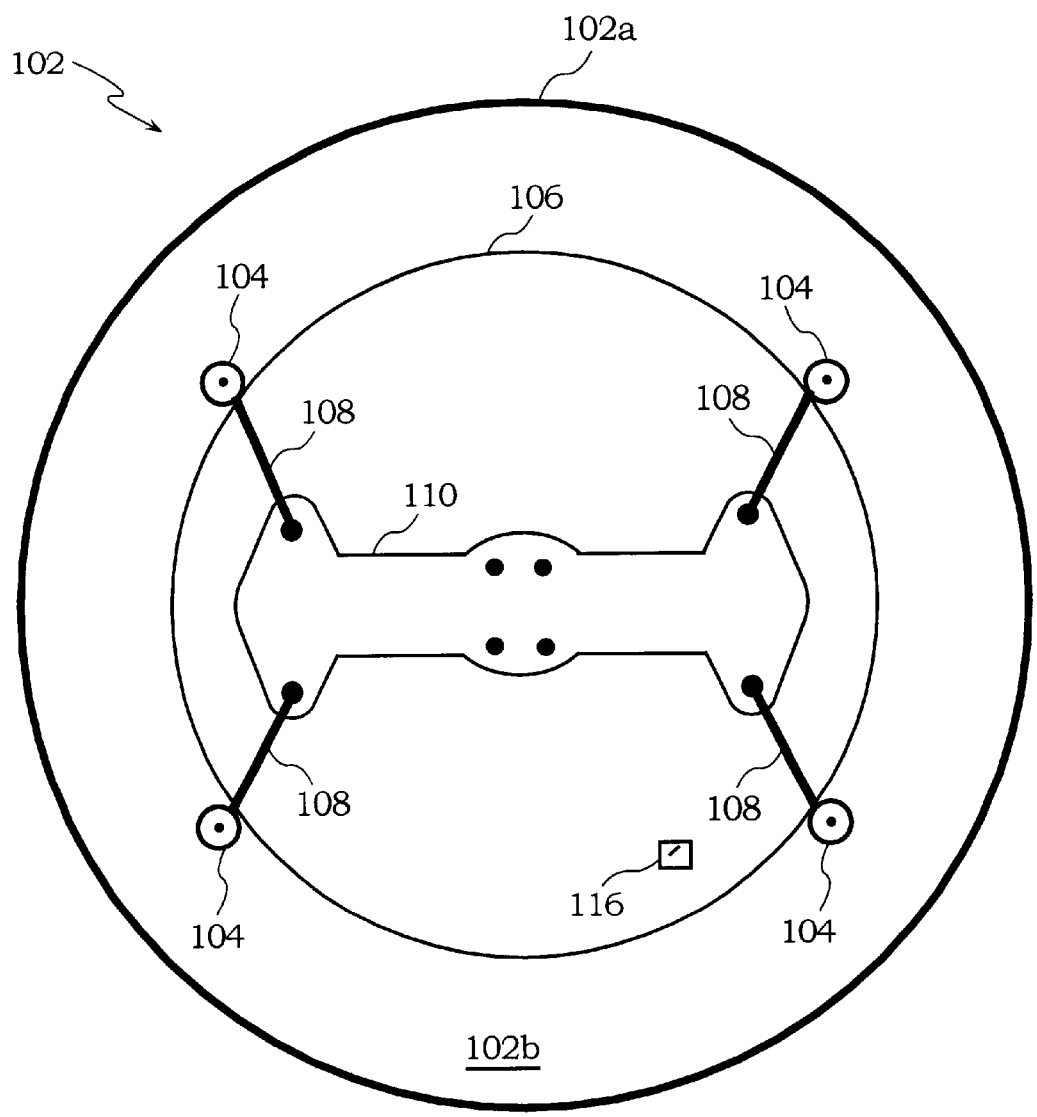
FIG. 4 is a top view of bowl 102 shown in FIG. 2.

FIG. 4 is a top view of bowl 102 shown in FIG. 2. As shown in FIG. 4, four rollers 104, each of which is mounted on one of spindle fingers 108, support substantially transparent wafer 106 above spindle arm 110. As mentioned above, during orientation of the nozzle, the use of substantially transparent wafer 106 enables an operator to determine whether DI water sprayed from the nozzle is contacting the center of the bottom side of the wafer. If the nozzle is not properly oriented, then the necessary adjustments can be made using substantially transparent wafer 106 before the processing of semiconductor wafers begins, as will be described in more detail below. It will be apparent from FIG. 4 that the spray of DI water from adjustable nozzle assembly 116 will be intermittently blocked by spindle arm 110 as it rotates within bowl 102. At the high rotational speeds, e.g., about 100 rpm–1,800 rpm, used during spin rinsing, however, such intermittent blocking does not prevent an effective amount of DI water from reaching the center of the bottom side of the wafer.

Figure 5:
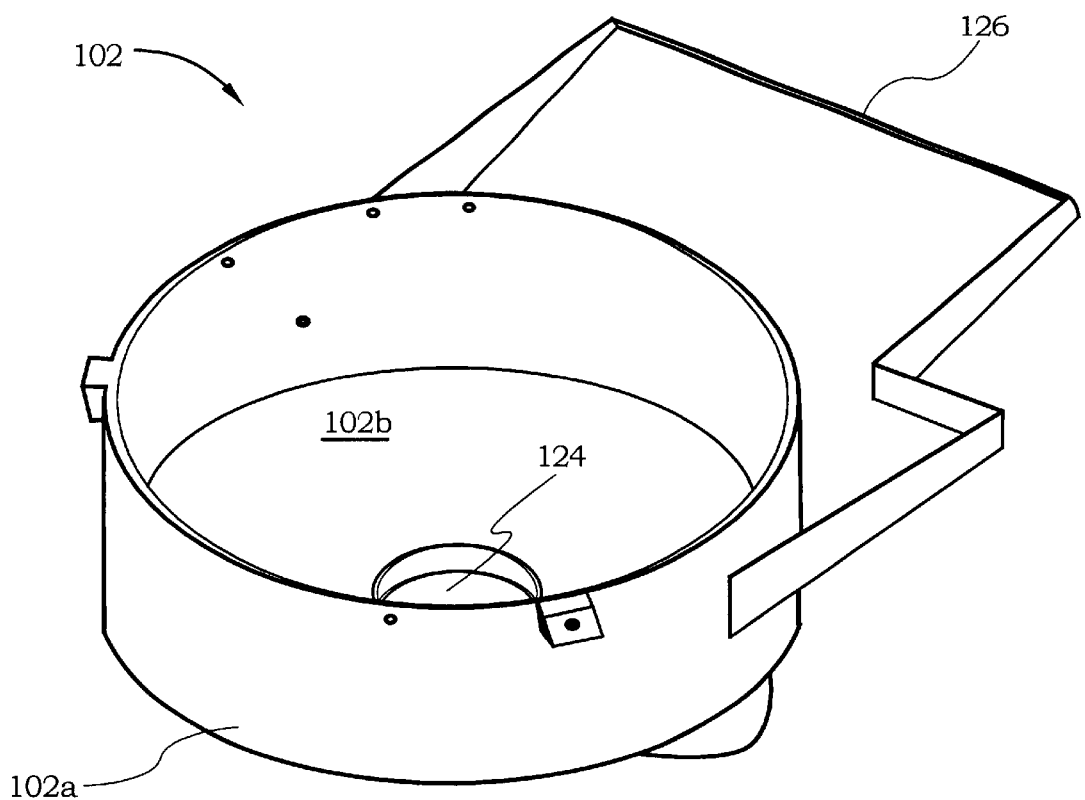
FIG. 5 is a three-dimensional view of an exemplary bowl that may be used to implement the adjustable nozzle assembly of the invention.

FIG. 5 is a three-dimensional view of an exemplary bowl that may be used to implement the adjustable nozzle assembly of the invention. As shown therein, bowl 102 includes bottom wall 102b and sidewall 102a that extends upwardly from bottom wall 102b. Bottom wall 102 has an opening 124 formed therein through which a shaft, e.g., shaft 112 shown in FIGS. 2 and 3, extends for spinning a semiconductor wafer disposed in bowl 102, as is well known to those skilled in the art. Sidewall 102a, which is generally cylindrical, is provided with channel 126 that collects runoff water in an SRD station. Bowl 102 may be made of any suitable material, e.g., polypropylene. As is well known to those skilled in the art, the diameter of the bowl is selected to be a desired amount larger than the diameter of the semiconductor wafers being processed.

Figure 6:
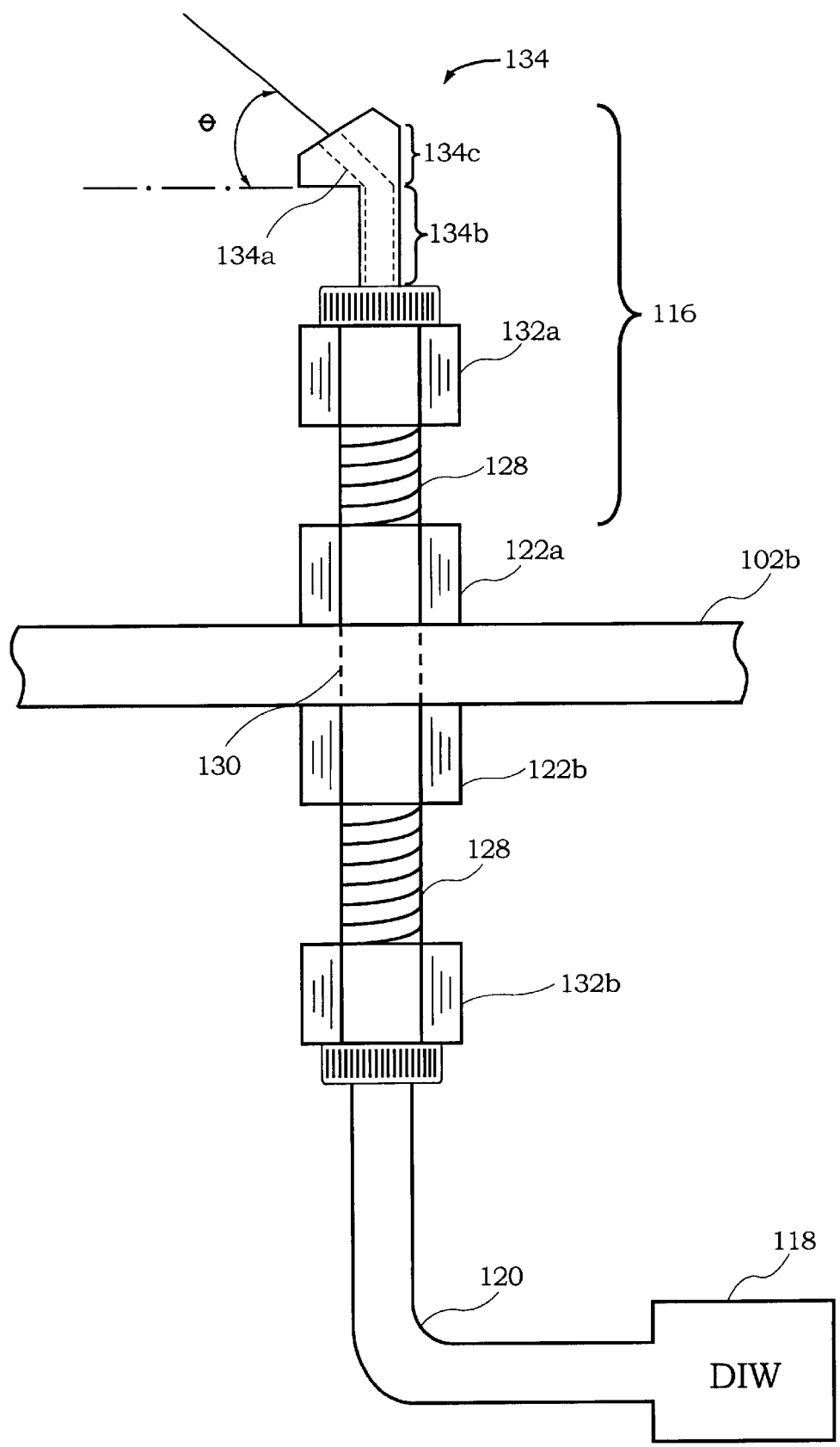
FIG. 6 is an enlarged, detailed view of adjustable nozzle assembly 116 shown in FIG. 2.

FIG. 6 is an enlarged, detailed view of adjustable nozzle assembly 116 shown in FIG. 2. As shown in FIG. 6, connector tube 128 extends through opening 130 in bottom wall 102b of bowl 102. The outer surface of connector tube 128 is threaded with, e.g., 7/16–20 threads. Connector caps 132a and 132b, each of which has an opening therethrough, are provided at the opposing ends of connector tube 128. Portions of the inner surfaces defining the openings in connector caps 132a and 132b are threaded with complementary threads to those on the outer surface of connector tube 128. This enables connector caps 132a and 132b to be threaded onto the opposing ends of connector tube 128.

Connector tube 128 is secured to bottom wall 102b by a pair of nuts 122a and 122b, with nut 122a engaging a top surface of bottom wall 102b and nut 122b engaging a bottom surface of bottom wall 102b. If desired, one of nuts 122a and 122b may be integral with connector tube 128. In one embodiment of the invention, nut 122a is integral with connector tube 128. In this embodiment, after connector tube 128 has been inserted through opening 130 so that nut 122a engages the top surface of bottom wall 102b, nut 122b is threaded onto connector tube until it engages the bottom surface of bottom wall 102b. It will be apparent to those skilled in the art that other equivalent fastening methods, e.g., welding, also may be used to secure connector tube 128 to bottom wall 102b.

With continuing reference to FIG. 6, nozzle 134 has channel 134a defined therein and includes tubular portion 134b and head portion 134c. Tubular portion 134b is disposed in the opening of connector cap 132a. The orientation of channel 134a defined in nozzle 134 changes at head portion 134c. In particular, the portion of channel 134a defined in head portion 134c is preferably at an angle, θ, of about 35 degrees to about 75 degrees relative to a plane perpendicular to the portion of channel 134a defined in tubular portion 134b. In one embodiment of the invention, the portion of channel 134a defined in head portion 134c is at an angle, θ, of about 54.5 degrees relative to a plane perpendicular to the portion of channel 134a defined in tubular portion 134b.

At the opposite end of connector tube 128, one end of liquid supply tube 120 is disposed in the opening of connector cap 132b. The other end of liquid supply tube 120 is coupled in flow communication with source 118 of DI water. In operation, DI water from source 118 flows through liquid supply tube 120 into the inner passageway of connector tube 128. DI water then flows out of connector tube 128 through channel 134a of nozzle 134.

Figure 7A:
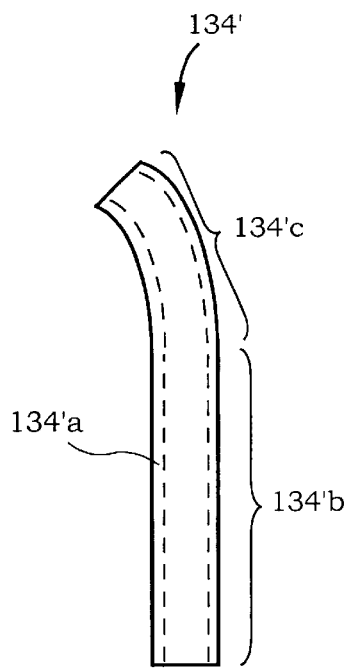
FIGS. 7A and 7B show side views of two alternative nozzle configurations.
Figure 7B:
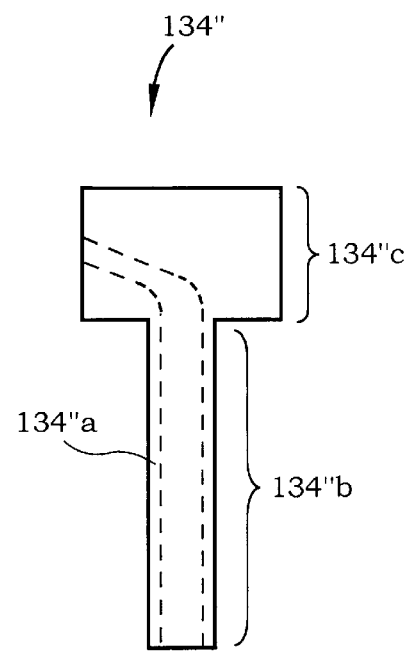

FIGS. 7A and 7B show side views of two alternative nozzle configurations. As shown in FIG. 7A, nozzle 134' is formed of a single piece of rigid tubing. In this nozzle configuration, head portion 134'c includes the portion of nozzle 134' that is at an angle relative to tubular portion 134'b. The relative angle of channel 134'a in head portion 134'c is preferably the same as that described above in connection with FIG. 6. As shown in FIG. 7B, head portion 134"c is comprised of a solid block. In this nozzle configuration, channel 134"a in head portion 134"c is at an angle relative to channel 134"a in tubular portion 134"b. The relative angle of channel 134"a in head portion 134"c is preferably the same as that described above in connection with FIG. 6. In view of the nozzle configurations shown in FIGS. 6, 7A, and 7B, it will be apparent to those skilled in the art that a variety of head portions may be used to change the orientation of the channel defined in the nozzle to the desired angle.

Figure 8A:
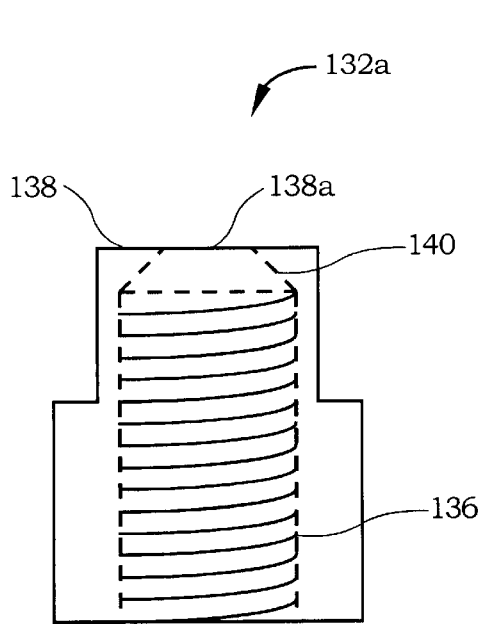
FIG. 8A is a cross-sectional view of connector cap 132*a* shown in FIG. 6.

FIG. 8A is a cross-sectional view of connector cap 132a shown in FIG. 6. As shown therein, threaded inner surface 136 has a diameter that is larger than that of opening 138a in top surface 138. Tapered surface 140 extends between threaded inner surface 136 and opening 138a in top surface 138. In one embodiment of the invention, the configuration of connector cap 132b (see FIG. 6) is the same as that shown in FIG. 8A.

Figure 8B:
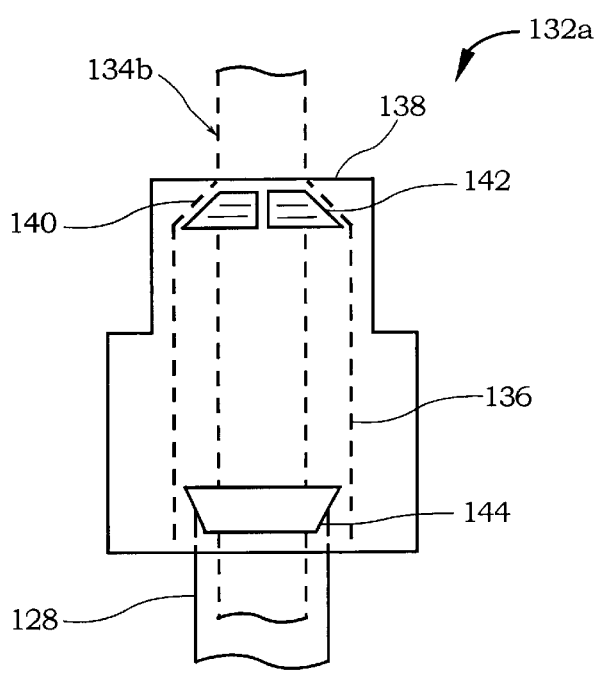
FIG. 8B is a cross-sectional view of connector cap 132*a* shown in FIG. 6 that illustrates where sealing members may be provided in accordance with one embodiment of the invention.

FIG. 8B is a cross-sectional view of connector cap 132a shown in FIG. 6 that illustrates where sealing members may be provided in accordance with one embodiment of the invention. As shown therein, sealing member 142, which preferably has a generally frustoconical shape, is positioned proximate to top surface 138. The size of sealing member 142 is selected so that the outer tapered surface of member 142 rests firmly against tapered surface 140 of connector cap 132a. In addition, the narrower opening of sealing member 142 has a diameter selected to receive snugly tubular portion 134b of nozzle 134. In one embodiment, sealing member 142 may be a split ring seal.

Sealing member 144, which also preferably has a generally frustoconical shape, is positioned proximate to one end of connector tube 128 when connector cap 132a is threaded thereon. The size of sealing member 144 is selected so that at least a portion of the outer tapered surface of member 144 has a diameter larger than the inner diameter of connector tube 128. With this configuration, sealing member 144 rests firmly within the opening at one end of connector tube 128. In addition, the narrower opening of sealing member 144 has a diameter selected to receive snugly tubular portion 134b of nozzle 134. In one embodiment, sealing member 144 may be a bulkhead fitting seal.

Tubular portion 134b of nozzle 134 is held in place within the opening in connector cap 132a by the compression fit between tubular portion 134b and sealing members 142 and 144. It will be apparent to those skilled in the art that the degree of compression fit is primarily a function of the relative sizes of tubular portion 134b and the narrower openings of sealing members 142 and 144. The degree of compression fit is preferably sufficient to hold tubular portion 134b securely in place when the nozzle is in operation, while at the same time allowing the position of tubular portion 134b to be adjusted by hand without the application of excessive force.

With the compression fit arrangement of the present invention, the position of nozzle 134 may be adjusted either axially or rotationally. In particular, the axial position of nozzle 134 may be adjusted by sliding tubular portion 134b within the opening in connector cap 132a. When the nozzle is mounted on a bottom wall of a bowl as shown, for example, in FIG. 2, this axial sliding action will adjust the vertical height of the nozzle. When the nozzle is mounted on a sidewall of a bowl as shown, for example, in FIG. 3, this axial sliding action will adjust the horizontal position of the nozzle. The angular position of nozzle 134 may adjusted by rotating tubular portion 134b within the opening in connector cap 132a.

The sealing member arrangement illustrated in FIG. 8B also may be used in connection with connector cap 132b (see, e.g., FIG. 6). With this arrangement, liquid supply tube 120 is held in place within the opening in connector cap 132b by the compression fit between tube 120 and the sealing members, e.g., sealing members 142 and 144 shown in FIG. 8B. It will be apparent to those skilled in the art that the degree of compression fit is primarily a function of the relative sizes of liquid supply tube 120 and the narrower openings of the sealing members. In one embodiment, liquid supply tube may be ¼-inch plastic tubing. The degree of compression fit is preferably sufficient to hold liquid supply tube 120 securely in place when the nozzle is in operation.

Figure 9:
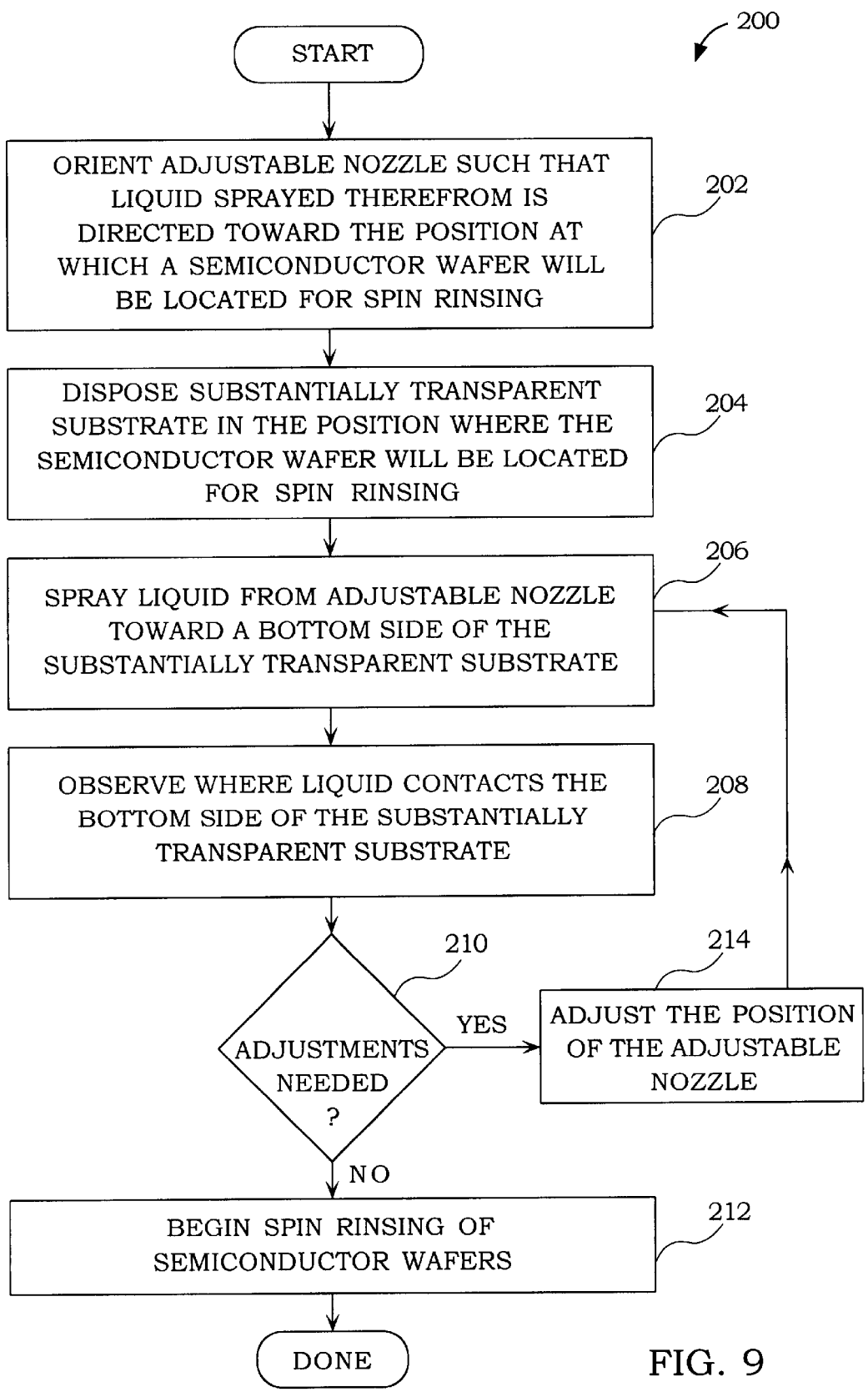
FIG. 9 shows a flowchart diagram 200 illustrating the method operations performed in spin rinsing a bottom side of a semiconductor wafer in accordance with one embodiment of the present invention.

FIG. 9 shows a flowchart diagram 200 illustrating the method operations performed in spin rinsing a bottom side of a semiconductor wafer in accordance with one embodiment of the present invention. The method begins in operation 202 in which an adjustable nozzle, e.g., the adjustable nozzle shown in FIG. 6, is oriented such that liquid sprayed therefrom is directed toward the position where a semiconductor wafer will be disposed for spin rinsing. The adjustable nozzle may be provided in a suitable bowl, e.g., the bowl shown in FIG. 5. In operation 204 a substantially transparent substrate, which may have the circular shape of a wafer, is disposed in the position where the semiconductor wafer will be disposed for spin rinsing. By way of example, this may be accomplished by supporting the substantially transparent wafer with rollers situated above a spindle arm, as illustrated in FIGS. 2 and 3. In operation 206 liquid, e.g., DI water, is sprayed toward the bottom side of the substantially transparent wafer. In operation 208 it is observed where the liquid contacts the bottom side of the wafer. Because the wafer is substantially transparent, an operator can determine where the liquid contacts the bottom side of the wafer simply by looking through the wafer from above. As discussed in detail above, to ensure that the bottom side of the wafer is thoroughly rinsed to remove undesirable particulate contamination, the liquid should contact the center of the bottom side of the wafer.

The method then proceeds to decision operation 210 in which it is determined by observation whether adjustments to the position of the adjustable nozzle are necessary. If the liquid contacts the center of the bottom side of the wafer, then the adjustable nozzle is properly aligned such that no adjustments are necessary and the method proceeds to operation 212. On the other hand, if the liquid contacts a peripheral portion of the wafer, then positional adjustments are necessary and the method proceeds to operation 214. Similarly, if upon observation it is found that the liquid is not contacting the bottom side of the wafer at all, e.g., in the case of insufficient DI water pressure, then adjustments are necessary and the method proceeds to operation 214.

In operation 214 the position of the adjustable nozzle is adjusted to direct the spray of liquid toward the center of the bottom side of the wafer. As set forth above in connection with the description of, for example, FIG. 8B, the position of the adjustable nozzle may be adjusted by sliding or rotating tubular portion 134b in connector cap 132a to vary the position of head portion 134c. More particularly, when the adjustable nozzle assembly is mounted on a bottom wall of a bowl, the vertical height of head portion 134c may be varied by sliding tubular portion 134b up and down in connector cap 132a. In some instances, the situation in which the DI water is not reaching the bottom side of the wafer may be remedied by raising head portion 134c so that it is closer to the bottom side of the wafer. The angular position of head portion 134c may be varied by rotating tubular portion 134b in connector cap 132a. The situation in which the DI water contacts a peripheral portion of the bottom side of the wafer may be remedied by changing one or both of the vertical height and angular position of head portion 134c. Once the position of the adjustable nozzle has been adjusted, the method returns to operation 206 so that operations 206, 208, and 210 may be repeated.

Once it is determined in operation 210 that the adjustable nozzle is properly aligned, the method proceeds to operation 212. In operation 212 the spin rinsing of semiconductor wafers begins and the method is done. Absent unusual circumstances, the spray of DI water from the adjustable nozzle will contact the center of the bottom side of the semiconductor wafers because the adjustable nozzle has been previously aligned using the substantially transparent wafer. Consequently, despite not being able to see through either the wafer or the bowl to confirm visually that the spray of DI water is actually contacting the center of the bottom side of the wafer, an operator can be reasonably certain that the bottom side of a semiconductor wafer is being thoroughly rinsed.

It will be apparent to those skilled in the art that the substantially transparent substrate used in the process of orienting the adjustable nozzle need not be shaped as a wafer, i.e., circular. If desired, substantially transparent substrates having other shapes, e.g., polygonal, may be used. As used in connection with the description of the invention, the phrase "substantially transparent substrate" means a substrate that transmits enough light so that objects or images on one side of the substrate can be seen from the other side of the substrate.

The components of the adjustable nozzle of the present invention may be formed from any suitable material, e.g., polyethylene terepthalate (PET). The substantially transparent wafer is preferably formed of polycarbonate; however, other suitable materials, e.g., acrylics and glass, also may be used. When polycarbonate is used, the substantially transparent wafer may be fabricated by machining a blank sheet. When materials other than polycarbonate are used, it will be apparent to those skilled in the art that the use of other known techniques to fabricate the substantially transparent substrate may be more appropriate.

The nozzle assembly of the present invention advantageously enables an operator to adjust easily the position of the nozzle to compensate for tolerances in the spin station, e.g., the spindle height may vary from spin station to spin station. In the method for spin rinsing a bottom side of a semiconductor wafer of the present invention, a substantially transparent substrate is advantageously used to orient the adjustable nozzle to ensure that liquid, e.g., DI water, is sprayed onto the center of the bottom side of a semiconductor wafer. This ensures that the entire bottom side of the wafer is thoroughly rinsed. Testing has confirmed that use of the nozzle assembly of the present invention with the adjustable nozzle properly oriented yields improved wafer particle counts on the bottom side of semiconductor wafers relative to the conventional nozzle shown in FIGS. 1A and 1B.

In summary, the present invention provides an adjustable nozzle assembly, a spin, rinse, and dry station for spin rinsing a bottom side of a semiconductor wafer including the adjustable nozzle assembly, and a method for spin rinsing a semiconductor wafer. The invention has been described herein in terms of several preferred embodiments. Other embodiments of the invention will be apparent to those skilled in the art from consideration of the specification and practice of the invention. For example, the nozzle assembly may be modified to include multiple nozzles or more than one nozzle assembly may be mounted in a bowl. The embodiments and preferred features described above should be considered exemplary, with the invention being defined by the appended claims.

What is claimed is:

1. A nozzle assembly, comprising:

a connector tube having a first end and a second end, an outer surface of said connector tube being threaded;

first and second nuts disposed on the connector tube;

a first cap having an opening therethrough, said first cap having a top surface and a threaded inner surface, and said first cap being threaded onto said first end of said connector tube;

a second cap having an opening therethrough, said second cap having a top surface and a threaded inner surface, said second cap being threaded onto said second end of said connector tube; and a nozzle having a tubular portion defining a channel, said tubular portion being disposed in said opening of said first cap so that a position of said nozzle can be axially and rotationally adjusted.

2. The nozzle assembly of claim 1, wherein the nozzle further comprises a head portion having a channel defined therein.

3. The nozzle assembly of claim 1, wherein one of the first and second nuts is integral with the connector tube.

4. The nozzle assembly of claim 1, wherein the threaded inner surfaces of the first and second caps have a first diameter, openings in the top surfaces of the first and second caps have a second diameter, the second diameter being smaller than the first diameter, and tapered surfaces extend between the threaded inner surfaces of the first and second caps and the openings in the top surfaces of the first and second caps.

5. A nozzle assembly, comprising:

a connector tube having a first end and a second end, an outer surface of said connector tube being threaded;

first and second nuts disposed on the connector tube;

a first cap having an opening therethrough, said first cap having a top surface and a threaded inner surface, and said first cap being threaded onto said first end of said connector tube;

a second cap having an opening therethrough, said second cap having a top surface and a threaded inner surface, and said second cap being threaded onto said second end of said connector tube; and a nozzle having a head portion, a tubular portion, and a channel defined therein, said channel defined in said head portion of said nozzle being at an angle of about 35 degrees to about 75 degrees relative to a plane perpendicular to said channel defined in said tubular portion of said nozzle, and said tubular portion being disposed in said opening of said first cap so that a position of said nozzle can be axially and rotationally adjusted.

6. The nozzle assembly of claim 5, wherein one of the first and second nuts is integral with the connector tube.

7. A nozzle assembly, comprising:

a connector tube having a first end and a second end, an outer surface of said connector tube being threaded;

first and second nuts disposed on the connector tube;

a first cap having an opening therethrough, said first cap having a top surface and a threaded inner surface, and said first cap being threaded onto said first end of said connector tube;

a second cap having an opening therethrough, said second cap having a top surface and a threaded inner surface, said second cap being threaded onto said second end of said connector tube;

first sealing members provided proximate to the top surfaces of the first and second caps;

second sealing members provided proximate to the first and second ends of the connector tube; and a nozzle having a tubular portion defining a channel, said tubular portion being disposed in said opening of said first cap so that a position of said nozzle can be axially and rotationally adjusted.

8. The nozzle assembly of claim 7, wherein one of the first and second nuts is integral with the connector tube.

9. The nozzle assembly of claim 7, wherein the first sealing members are split ring seals and the second sealing members are bulkhead fitting seals.

\* \* \* \* \*